United States Patent [19]

Katz et al.

[11] 4,113,547

[45] Sep. 12, 1978

[54] FORMATION OF EPITAXIAL LAYERS ON SUBSTRATE WAFERS UTILIZING AN INERT HEAT RADIATION RING TO PROMOTE UNIFORM HEATING

[75] Inventors: Lewis Emanuel Katz; Carl Lewis Paulnack, both of Allentown, Pa.

[73] Assignee: Bell Telephone Laboratories, Incorporated, Murray Hill, N.J.

[21] Appl. No.: 853,126

[22] Filed: Nov. 21, 1977

Related U.S. Application Data

[63] Continuation-in-part of Ser. No. 729,682, Oct. 5, 1976, abandoned.

[51] Int. Cl.$^2$ .................. H01L 21/205; C23C 13/08; H05B 5/08
[52] U.S. Cl. ..................................... 156/612; 118/48; 118/49.5; 118/500; 148/175; 156/613; 219/10.49 R; 219/10.67; 427/45; 427/248 R; 427/299
[58] Field of Search ................ 148/174, 175; 156/610, 156/612, 613; 118/48, 49, 49.1, 49.5, 500; 427/45, 86, 248, 299; 219/10.41, 10.49, 10.67; 165/135, 136; 432/226, 253

[56] References Cited

U.S. PATENT DOCUMENTS

| | | | |
|---|---|---|---|
| 3,359,143 | 12/1967 | Heywang et al. | 148/175 X |
| 3,419,424 | 12/1968 | Steggewentz et al. | 156/613 X |
| 3,436,255 | 4/1969 | Harris et al. | 156/613 UX |
| 3,539,759 | 11/1970 | Spiro et al. | 219/10.49 |
| 3,574,006 | 4/1971 | Dersin et al. | 148/175 X |
| 3,845,738 | 11/1974 | Berkman et al. | 118/49 |
| 3,892,940 | 7/1975 | Bloem et al. | 219/10.67 X |

OTHER PUBLICATIONS

Bratter et al., "Apparatus for Epitaxial Deposition," I.B.M. Tech. Discl. Bull., vol. 16, No. 4, Sep. 1973, p. 1279.
Goemans et al., "Control of Slip ... with Profiled Susceptors," J. Crystal Growth, v. 31, 1975, pp. 308–311.

Primary Examiner—L. Dewayne Rutledge
Assistant Examiner—W. G. Saba
Attorney, Agent, or Firm—H. W. Lockhart

[57] ABSTRACT

A method is described for growing epitaxial layers of material on monocrystalline substrates, chiefly silicon, which are substantially free of slip dislocations. The method involves placing an encircling ring of inert, heat resistant material around the rim of the substrate and over the peripheral surface of the substrate to suppress radiation from the peripheral portion of the wafer. The generation of slip dislocations is inhibited because heat is more uniformly distributed throughout the wafer.

4 Claims, 3 Drawing Figures

FORMATION OF EPITAXIAL LAYERS ON SUBSTRATE WAFERS UTILIZING AN INERT HEAT RADIATION RING TO PROMOTE UNIFORM HEATING

CROSS REFERENCE TO RELATED APPLICATION

This application is a continuation-in-part of my copending application, Ser. No. 729,682, filed Oct. 5, 1976, row abandoned.

BACKGROUND OF THE INVENTION

1. Field of the Invention

This invention relates to a method of forming epitaxial layers on substrate materials and, more particularly, to a method of forming semiconductor epitaxial layers on semiconductor wafers.

2. Description of the Prior Art

In the production of semiconductor devices including transistors and integrated circuits, an important and basic process is the formation of epitaxial layers on monocrystalline semiconductor wafer substrates. Although the process of epitaxial layer formation, particularly with respect to silicon semiconductor material, is highly developed, a problem arises which still prevents the realization of the near perfection which seems inherently possible with monocrystalline semiconductor material.

In particular, during the formation of epitaxial layers of pyrolytic decomposition processes at relatively high temperatures, radiation from the rim and peripheral edge surface of the wafer substrate reduces the temperature in that portion in comparison to central portions of the wafer surface. These temperature gradients produce internal stresses during epitaxial crystal growth which cause imperfections termed slip dislocations. Moreover, these dislocations tend to propagate through the deposited epitaxial film following patterns determined by the crystallographic orientation of the substrate surface. Although the material remains a single crystal, the presence of these slip dislocations affects the quality of the subsequently produced semiconductor devices, generally resulting in electrically degraded PN junctions.

The presence of slip dislocations reduces the yield of satisfactory semiconductor devices from such a wafer. Devices coincident with portions of the wafer containing such dislocations will generally be unsatisfactory and must be discarded.

Accordingly, an object of this invention is a method of inhibiting slip dislocation during the epitaxial deposition process.

SUMMARY OF THE INVENTION

In accordance with this invention, semiconductor substrate wafers are mounted in epitaxial growth reactors in the usual fashion. A ring of inert, heat resistant material, such as silicon, is then placed over the periphery of each wafer so as to surround the rim of the wafer and cover a relatively narrow peripheral portion of the deposition surface of the wafer without actually touching the wafer.

During the vapor deposition process at high temperature, which may be from 1000° to 1300° C. but is typically about 1100° to 1200 C. for silicon, the peripheral ring apparently reduces radiation from the rim and peripheral surface of the substrate wafer thus increasing the temperature in those portions. By suitably sizing and spacing the ring the temperature across the surface of the wafer is substantially uniform. It is important not to have the ring touch the wafer substrate so as not to provide a heat conduction path. Thus, by blocking radiation, and precluding conduction the emission of heat from the rim and peripheral surface portion of the wafer is significantly reduced.

The process in accordance with this invention is significant also in that the presence of the peripheral ring has no deleterious effect upon the quality and dimensions of the epitaxial layer. Semiconductor wafers are generally produced to standard size, typically 2 inch and 3 inch diameters, and larger, for example 100 millimeters, and the enclosing rings in accordance with this invention are reusable.

The invention and its other objects and features will be better understood from the following detailed description taken in conjunction with the drawing in which.

DETAILED DESCRIPTION

Figure 1:
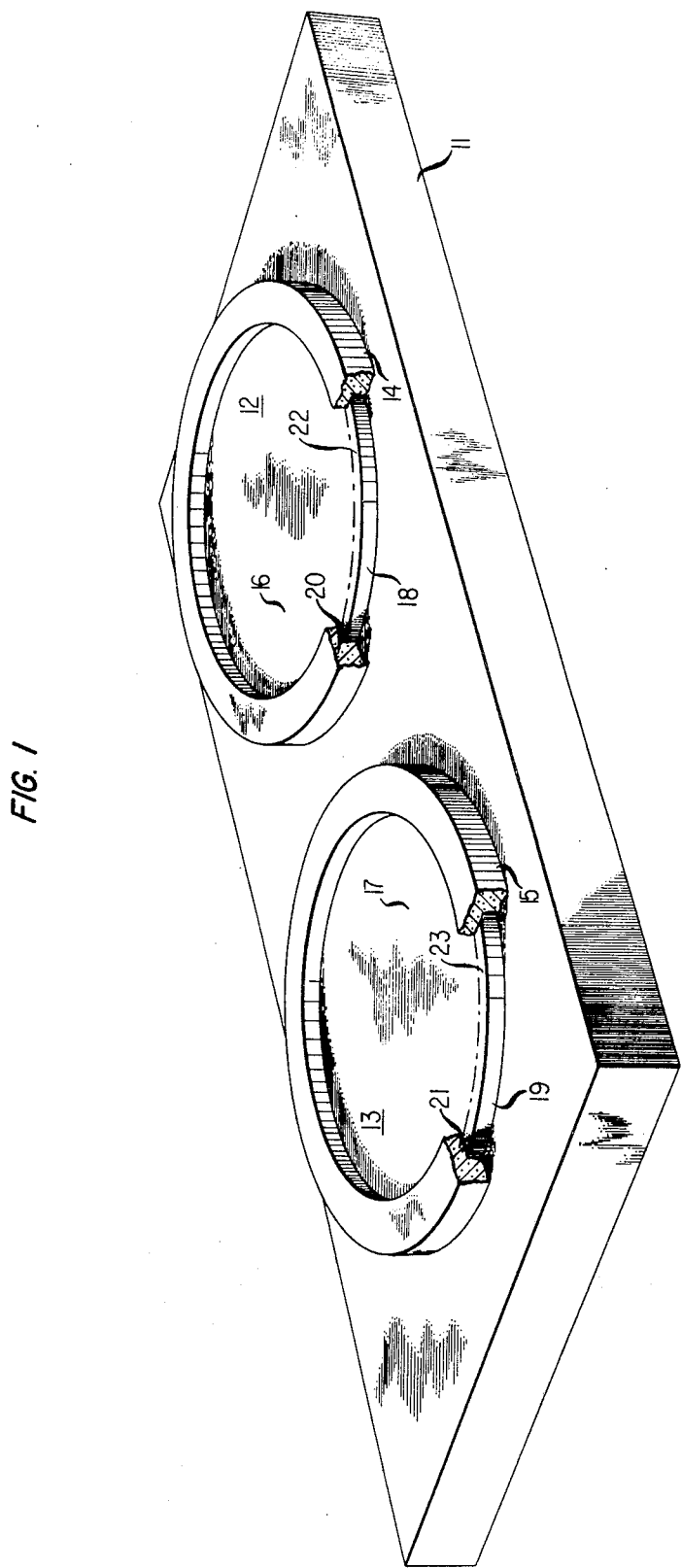
FIG. 1 shows, in perspective, a pair of semiconductor wafers on a susceptor with encircling rings, partially cut away, in accordance with this invention.

The epitaxial deposition of semiconductor material has become a well known art. For example, the deposition of single crystal silicon by the pyrolytic decomposition of a silicon compound in gaseous form which then is flowed over the heated substrate wafers, is a basic method for producing the starting material from which devices are fabricated. The process is usually done in a reactor at an elevated temperature with the substrate held at a high temperature while mounted on susceptors, which typically are of a graphite or other similar chemically inert, heat resistant materials. Referring to FIG. 1, the block 11 represents a simple form of susceptor, such as might be used in a linear type of reactor. Susceptors may be of various configurations depending on the particular type of reactor in which it is used. Wafers 12 and 13 of semiconductor material rest on the susceptor 11 and are encircled by rings 14 and 15 respectively. As shown, each ring encloses the rim 18, 19 of the wafer and also has a lip portion 20, 21 which covers a portion 22, 23 of the periphery of the major surface 16, 17 upon which epitaxial deposition occurs. At the present time, semiconductor wafers typically are made in nominal sizes from 3 to 6 inches in diameter. The typical tolerance for a 3 inch wafer is from 2.98 to 3.000 inches. For the 3 inch size wafer a lipped ring in accordance with this invention may have an inside diameter for fitting over the wafer of 3.01 inches thus ensuring at least 5 mils clearance between wafer rim and ring.

Figure 2:
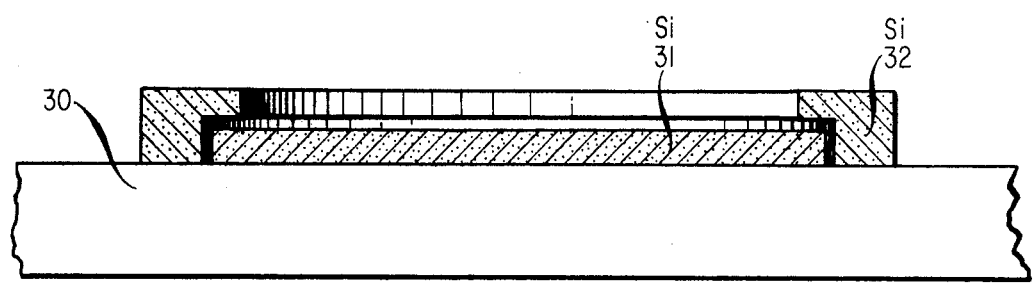
FIG. 2 is a cross section taken through one wafer and enclosing ring on a susceptor.

The relation of the encircling ring to the substrate wafer is shown in greater detail in FIG. 2 in which the wafer 31 on a portion of susceptor 30 is surrounded by the ring 32. The clearance between the wafer and the ring may range from 1 to 10 mils and preferably is from 2 to 5 mils. The lip portion of the ring has a width ranging from 1 to 5 millimeters, designed to make the peripheral temperature of the wafer equal or slightly higher than that of the wafer center. Rings 12 and 13 advantageously are made of high purity silicon and may be fabricated by techniques known in the art including by machining and by various molding techniques. In a specific embodiment, a ring for use with a 3 inch wafer has a lip portion with a width of about 1 millimeter. (0.0394 inches). The lip portion may be tapered toward the center of the wafer to improve the gas flow thereover. The height of the ring portion above the wafer surface likewise provides a clearance similar to that for the rim clearance. Typically, rings having a total thickness of from about 0.1 inches to 0.2 inches (100 to 200 mils) are made using presently available materials and fabrication techniques. These rings typically are used with semiconductor wafers having a nominal thickness of 20 mils ±1.0. Thus, the dimension from the bottom of the ring to the underside of the lip may range from 22 to 31 mils. Preferably rings are classified for use with wafers of particular dimensions to realize the optimum clearance range of 2 to 5 mils mentioned above. Machining techniques are available which enable fabrication of rings to the exact shape of the wafers which usually include a flat portion as an orientation means. Materials in addition to both monocrystalline and polycrystalline silicon which are suitable for use as ring material include high purity graphite and silicon carbide. Other materials also may be found suitable subject to the requirements of the application such as temperature resistance, inertness, vapor pressure and resistance to emission of particulate matters.

Referring again to FIG. 1 the susceptor 11 having the substrate wafers 12, 13 with their encircling rings 14, 15 mounted thereon is placed in the epitaxial reactor and the deposition process is carried out in the usual fashion to produce an epitaxial layer on surfaces 16 and 17. On completion of the deposition process the susceptor and wafers are removed and the encircling rings may be reused for wafers of the same nominal size. The deposited wafer upon examination will be found to be substantially free of slip dislocations or to have a minimal amount such as to little affect the device yield obtained from the wafer.

Although the invention has been described in a specific embodiment involving deposition of epitaxial silicon on a monocrystalline silicon wafer, it will be apparent that it is useful for the deposition of any epitaxial material even other than semiconductor material, as well as for processes in which the deposited layer is a different material from the monocrystalline substrate. Moreover, although the encircling means in accordance with this invention has been described as circular, various shapes including rectilinear configurations can be used, requiring only that the encircling means cover the rim portion and the peripheral portion of the surface of the substrate.

Figure 3:
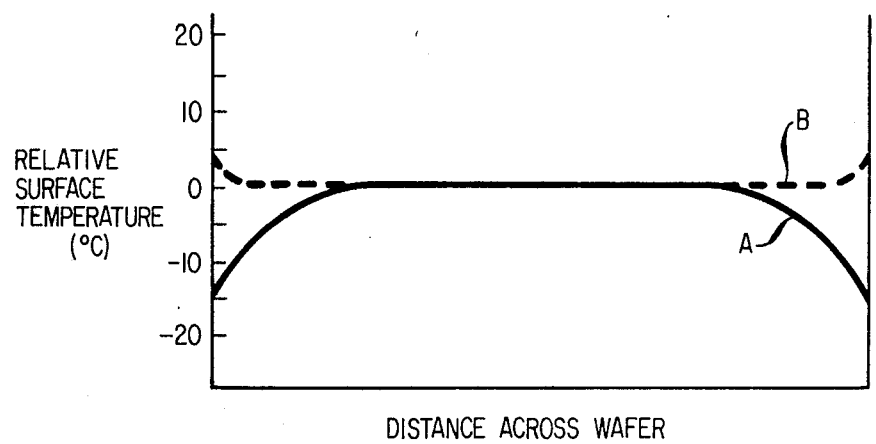
FIG. 3 is a graph showing typical relative temperatures across the wafer surface with and without the encircling ring in accordance with this invention.

Thus, the encircling rings in accordance with this invention, provide a means for substantially reducing the occurrence of slip dislocations in deposited films on substrates. The graphs of FIG. 3 illustrate the difference in heat distribution produced by the use of encircling rings. Solid curve A depicts the relative temperature at the surface of the substrate wafer during heating for the deposition process. The edges of the wafer are shown at a temperature about 15° C. less than the temperature of the surface of the major central portion of the wafer. Broken curve B shows the more desirable temperature profile attained by the use of an encircling ring in which the peripheral surface may show a slight rise of from 2° to 5° C. over a short distance. The absence of the gradient depicted in curve A avoids the internal stresses and consequent dislocations.

What is claimed is:

1. A method of suppressing slip dislocations in an epitaxial film grown by vapor deposition on a major surface of a semiconductor wafer by affecting the radiation of heat from portions of the wafer comprising;
    (a) mounting the wafer on the surface of a susceptor member in an epitaxial reactor,
    (b) heating the reactor including the wafer to an elevated temperature,
    (c) depositing a film of epitaxial semiconductor material on the major surface of the wafer, and
    (d) reducing the emission of heat from the rim and peripheral surface portions of the wafer by encircling the wafer with a ring of inert material which encloses both the rim and the peripheral portion of the major surface without touching the wafer, thereby to produce a substantially uniform temperature profile across the wafer.

2. The method in accordance with claim 1 in which the material of said wafer is silicon and said elevated temperature is from about 1000° to 1300° C.

3. The method in accordance with claim 1 in which the inert material is one selected from the group consisting of silicon, graphite, and silicon carbide.

4. The method in accordance with claim 1 in which the film of epitaxial semiconductor material is silicon.

* * * * *